(12) United States Patent
Kimura

(10) Patent No.: US 8,704,496 B2
(45) Date of Patent: Apr. 22, 2014

(54) CHARGE CONTROL SYSTEM

(75) Inventor: Masaru Kimura, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/143,483

(22) PCT Filed: Jun. 11, 2010

(86) PCT No.: PCT/JP2010/059910
§ 371 (c)(1),
(2), (4) Date: Jul. 6, 2011

(87) PCT Pub. No.: WO2011/155051
PCT Pub. Date: Dec. 15, 2011

(65) Prior Publication Data
US 2013/0069599 A1     Mar. 21, 2013

(51) Int. Cl.
*H02J 7/04* (2006.01)
*G01R 31/36* (2006.01)

(52) U.S. Cl.
USPC .......................................... 320/162; 702/63

(58) Field of Classification Search
USPC ................... 320/132, 157–159, 162–164; 180/65.29; 702/63
See application file for complete search history.

(56) References Cited

U.S. PATENT DOCUMENTS

| | | | |
|---|---|---|---|
| 6,044,331 A | 3/2000 | Saigo | |
| 6,234,932 B1 * | 5/2001 | Kuroda et al. | 477/3 |
| 6,646,419 B1 * | 11/2003 | Ying | 320/132 |
| 6,646,421 B2 | 11/2003 | Kimura et al. | |
| 7,664,577 B2 * | 2/2010 | Yamamoto et al. | 700/287 |
| 8,080,898 B2 * | 12/2011 | Fukuhara | 307/48 |

(Continued)

FOREIGN PATENT DOCUMENTS

| | | |
|---|---|---|
| JP | A-08-251713 | 9/1996 |
| JP | A-09-318718 | 12/1997 |

(Continued)

OTHER PUBLICATIONS

International Search Report issued in International Patent Application No. PCT/JP2010/059910 dated Sep. 7, 2010 (with translation).

*Primary Examiner* — Richard V Muralidar
*Assistant Examiner* — David Henze-Gongola
(74) *Attorney, Agent, or Firm* — Oliff PLC

(57) ABSTRACT

A charge control system (10) includes an electric power storage device (102), a variation suppression coefficient setting section (214) which sets a variation suppression coefficient, a variation suppression operation processing section which operates a charged state estimation operation value, and a charged state estimation section which estimates a charged state of the electric power storage device. The variation suppression coefficient setting section (214), when the charged state estimation operation value drops within a predetermined period during charging of the electric power storage device (102), changes the variation suppression coefficient such that, of the voltage across the electric power storage device detected by a voltage sensor (105) and a charged state estimation operation value which is obtained by the previous operation, a ratio of the voltage across the electric power storage device which is detected by the voltage detection section is smaller, for operating the charged state estimation operation value after the predetermined period.

3 Claims, 2 Drawing Sheets

(56) References Cited

U.S. PATENT DOCUMENTS

| | | |
|---|---|---|
| 8,150,572 B2 * | 4/2012 | Yamamoto et al. ............. 701/22 |
| 8,264,203 B2 * | 9/2012 | Darilek et al. ................ 320/132 |
| 2002/0196026 A1 | 12/2002 | Kimura et al. |
| 2003/0085690 A1 * | 5/2003 | Shiojima ....................... 320/164 |
| 2009/0295333 A1 * | 12/2009 | Ryu ............................... 320/134 |
| 2010/0131217 A1 * | 5/2010 | Ichikawa ....................... 702/63 |
| 2012/0191390 A1 * | 7/2012 | Kang et al. ..................... 702/63 |

FOREIGN PATENT DOCUMENTS

| | | |
|---|---|---|
| JP | A-2002-369391 | 12/2002 |
| JP | A-2006-256609 | 9/2006 |
| JP | A-2009-296699 | 12/2009 |
| WO | WO 2008156212 A1 * | 12/2008 |

\* cited by examiner

CHARGE CONTROL SYSTEM

TECHNICAL FIELD

The present invention relates to a charge control system, and more particularly to a charge control system including an electric power storage device which can be charged by using electric power supplied from an external commercial power source.

BACKGROUND ART

Plug-in hybrid vehicles or the like, in which a secondary battery which can be charged by connecting to a household electric wall socket is mounted, have been developed in recent years. For charging the secondary battery, charge control is performed such that a SOC (State of Charge) indicating the charged state of the secondary battery falls within a predetermined range. Here, while the SOC of a secondary battery can be estimated from an OCV (Open Circuit Voltage) of the secondary battery, as it is not possible to measure the OCV during charging of the secondary battery, the SOC of the secondary battery is estimated from a CCV (Closed Circuit Voltage) of the secondary battery. In this case, a relationship of CCV≈OCV+IR (wherein I represents electric current flowing in the secondary battery, and R is internal resistance of the secondary battery) is satisfied.

As technology related to the present invention, Patent Document 1, for example, discloses a charge control circuit for controlling the charging of a secondary battery. The charge control circuit has a structure including a voltage detection section which detects a terminal voltage of the secondary battery, an inclination acquisition section which interrupts charging during the charging of the secondary battery and performs inclination information acquisition processing for acquiring voltage inclination information indicating an amount of decrease of the terminal voltage per predetermined time from the terminal voltage detected by the voltage detection section during the interruption of the charging, and a charging termination determination section which executes determination processing for determining whether or not the charging of the secondary battery should be terminated based on the voltage inclination information acquired from the inclination acquisition section.

PRIOR ART DOCUMENT

Patent Document

Patent Document 1: JP 2009-296699 A

SUMMARY OF THE INVENTION

Technical Problems

Here, when the SOC of a secondary battery is estimated by using the Closed Circuit Voltage (CCV) as described above, there is a possibility that the accuracy of estimating the SOC is reduced, because, in this case, the value of IR varies in accordance with a variation of commercial electric power supplied through a household electric wall socket and therefore the CCV also varies. Accordingly, the estimation of SOC is performed by using an SOC estimation operation value which is obtained by an operation such as multiplication of the CCV by a predetermined variation suppression coefficient (which is a coefficient for operationally suppressing the variation of the commercial electric power).

However, because the variation suppression coefficient described above, for which a fixed value previously obtained empirically or the like is used, may not be an appropriate value depending on the characteristics, usage environments or the like of the secondary battery, there is a possibility that the estimation accuracy of SOC will be lowered.

The present invention is aimed at providing a charge control system in which the estimation accuracy of SOC of a secondary battery can be increased.

Solution to Problems

Preferably, a charge control system according to the present invention includes an electric power storage device which can be charged by using electric power supplied from an external commercial power source, a voltage detection section which detects a voltage across the electric power storage device, a variation suppression coefficient setting section which sets a variation suppression coefficient for operationally suppressing an effect of a variation of the electric power from the external commercial power source on the voltage across the electric power storage device, a variation suppression operation processing section which operates a charged state estimation operation value of the electric power storage device by using the voltage across the electric power storage device which is detected by the voltage detection section, the variation suppression coefficient which is set by the variation suppression coefficient setting section, and the charged state estimation operation value which is obtained by a previous operation, and a charged state estimation section which estimates a charged state of the electric power storage device based on the charged state estimation operation value, and when the charged state estimation operation value drops within a predetermined period during charging of the electric power storage device, the variation suppression coefficient setting section changes the variation suppression coefficient such that when operating the charged state estimation operation value after the predetermined period, of the voltage across the electric power storage device which is detected by the voltage detection section and the charged state estimation operation value which is obtained by the previous operation, a ratio of the voltage across the electric power storage device which is detected by the voltage detection section is smaller.

Further, in the charge control system according to the present invention, it is preferable that providing that the voltage across the electric power storage device which is detected by the voltage detection section is V, the variation suppression coefficient is t, the charged state estimation operation value which is obtained by the previous operation is $Vf_L$, and the charged state estimation operation value to be obtained by a current operation is Vf, the variation suppression operation section obtains Vf by using $Vf=(1-t)*Vf_L+t*V$, and the variation suppression coefficient setting section changes a value of the variation suppression coefficient t to a smaller value based on a coefficient changing reference value which is calculated when the charged state estimation operation value Vf drops within a predetermined period during charging of the electric power storage device.

Also, in the charge control system according to the present invention, it is preferable that when the number of times the charged state estimation operation value Vf drops within the predetermined period is x, the variation suppression coefficient setting section obtains, as the coefficient changing reference value, a drop average value obtained by dividing a sum of drop amounts of the charged state estimation operation value Vf within the predetermined period by x.

Further, in the charge control system according to the present invention, it is preferable that when the number of times the charged state estimation operation value Vf drops within the predetermined period is x, the variation suppression coefficient setting section sets x as the coefficient changing reference value.

Advantageous Effects of Invention

According to the charge control system having the above structure, when the charged state estimation operation value drops within a predetermined period during charging of the electric power storage device, in the operation formula for obtaining the charged state estimation operation value, the ratio of the voltage across the electric power storage device affected by the variation of electric power from the external commercial power source can be small compared to the charged state estimation operation value which is obtained by the previous operation. Consequently, it is possible to suppress the effects of variation in the electric power from the external commercial power source when obtaining the charged state estimation operation value by an operation.

MODE FOR CARRYING OUT THE INVENTION

In the following description, similar elements are designated by an identical numeral all through the drawings, and explanation thereof will not be repeated. Further, numerals which have been already referred to in the description will be referred to as necessary.

Figure 1:
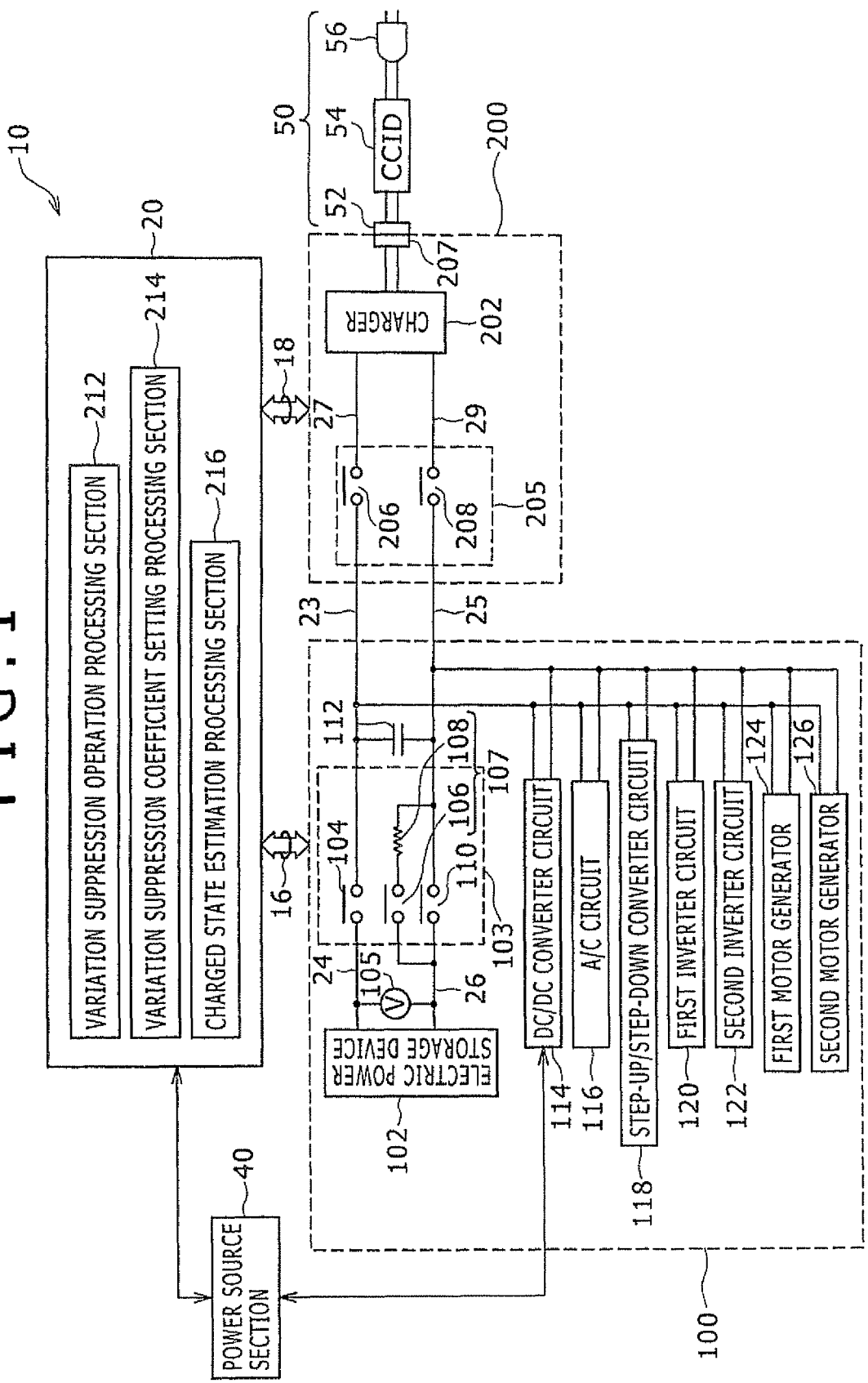
FIG. 1 a view illustrating a structure of a charge control system according to an embodiment of the present invention.

FIG. 1 is a view illustrating a structure of a charge control system 10. The charge control system 10 is configured by including a power storage device side circuit 100, a charging device side circuit 200, a power source section 40, a control section 20, and an external charging cable section 50. Here, the power storage device side circuit 100, the charging device side circuit 200, the power source section 40, and the control section 20 are mounted on a plug-in hybrid vehicle which performs traveling by using both an engine and a motor, and which can be charged by connecting to a household electric wall socket.

The power storage device side circuit 100 is configured by including an electric power storage device 102, a voltage sensor 105, a power storage side relay circuit section 103, a power storage side capacitor 112, a DC/DC converter circuit 114, an A/C circuit 116, a step-up/step-down converter circuit 118, a first inverter circuit 120, a second inverter circuit 122, a first motor generator 124, and a second motor generator 126.

The electric power storage device 102 is a battery for supplying electric power to the first motor generator 124 and the second motor generator 126. Further, the electric power storage device 102 is a chargeable/dischargeable DC power source, for which a lithium secondary battery including a negative electrode formed of a carbon material, an electrolytic solution for transferring lithium ions, and positive active materials capable of reversible intercalation and deintercalation of the lithium ions, for example, can be used.

The charging control of the electric power storage device 102 is performed such that an SOC (State Of Charge) indicating the charged state falls within a predetermined range. Here, while the SOC of the electric power storage device 102 can be estimated from an OCV (Open Circuit Voltage) of the electric power storage device 102, as it is not possible to measure the OCV during the charging of the electric power storage device 102, the SOC of the electric power storage device 102 is estimated from a CCV (Closed Circuit Voltage) of the electric power storage device 102. In this case, a relationship of CCV≈OCV+IR (wherein I represents an electric current flowing in the electric power storage device 102, and R is an internal resistance of the electric power storage device 102) is satisfied.

The voltage sensor 105 has a function of measuring the Closed Circuit Voltage (CCV) of the electric power storage device 102, which is a voltage across the electric power storage device 102.

The power storage side relay circuit section 103 is configured by including a first relay circuit section 104, a second relay circuit section 107, and a third relay circuit section 110. The first relay circuit section 104 is a relay which is connected in series with a positive-electrode side line 24 and which is controlled to be connected or disconnected in accordance with a control command from the control section 20. The second relay circuit section 107 is formed of a resistor element 108 and a relay 106, that are connected in series with each other, and is controlled to be connected or disconnected in accordance with a control command from the control section 20. Further, the second relay circuit section 107 is connected in series with a negative-electrode side line 26. The third relay circuit section 110 is a relay which is connected in parallel with the second relay circuit section 107, and is controlled to be connected or disconnected in accordance with a control command from the control section 20.

The power storage side capacitor 112 is connected between the positive-electrode side line 24 and the negative-electrode side line 26, and is a smoothing capacitor for smoothing a voltage variation between the positive-electrode side line 24 and the negative-electrode side line 26.

The step-up/step-down converter circuit 118 has a function of increasing the DC voltage supplied from the electric power storage device 102 by using a coil or the like. More specifically, the step-up/step-down converter circuit 118 stores electric current, flowing in a switching element such as a transistor in accordance with a switching operation, in a coil as an energy. The step-up/step-down converter circuit 118 then accumulates the stored energy in the capacitor in synchronization with the timing at which the transistor is turned off, thereby performing boosting. The step-up/step-down converter circuit 118 is also capable of decreasing the DC voltage supplied from the first inverter circuit 120 or the second inverter circuit 122 and charging the electric power storage device 102.

At the time of power running of a plug-in hybrid vehicle, the first inverter circuit 120 and the second inverter circuit 122 convert the DC voltage which is an output voltage of the step-up/step-down converter circuit 118 to an AC voltage, and supply the AC voltage to the first motor generator 124 or the second motor generator 126, so that the first motor generator 124 or the second motor generator 126 is rotationally driven. Also, at the time of regeneration of the plug-in hybrid vehicle, the first inverter circuit 120 and the second inverter circuit 122 convert the AC voltage generated by the first motor generator 124 or the second motor generator 126 to a DC voltage and supply the DC voltage to the electric power storage device 102 via the step-up/step-down converter circuit 118, so that the electric power storage device 102 is charged.

Each of the first motor generator 124 and the second motor generator 126 is a three-phase AC rotary electric machine formed by including a U-phase coil, a V-phase coil, and a W-phase coil. The first motor generator 124 generates power using motive power of an engine, which is split by a power split mechanism which is not shown. The electric power generated by the first motor generator 124 is used as desired in accordance with the travelling state of the plug-in hybrid vehicle and the SOC of the electric power storage device 102. Further, the second motor generator 126 is driven by at least one of the electric power stored in the electric power storage device 102 and the electric power generated by the first motor generator 124. It is a matter of course that the functions assigned to the first motor generator 124 and the second motor generator 124 described above may be reversed.

The DC/DC converter circuit 114 has a function of decreasing the output voltage of the electric power storage device 102 serving as a main battery to a charging voltage of the power source section 40 serving as an auxiliary battery.

The A/C circuit 116 is configured by including an inverter for converting the DC power of the electric power storage device 102 to AC power in order to control driving of a compressor which is not shown.

The charging device side circuit 200 is configured by including a charger 202 and a charging side relay circuit section 205.

The charger 202 is a device which is controlled by the control section 20 and which converts the AC power supplied from the external commercial power source to DC power, and supplies the DC power to the electric power storage device 102. More specifically, the AC power from the external commercial power source is input to the charger 202 via an external charging cable section 50 and is converted to the DC power by an AC/DC converter circuit. Then, the DC power is converted to AC power with high frequency by the DC/AD converter circuit, and the AC power with high frequency is further converted to a voltage level in accordance with the ratio of the numbers of windings of a primary coil and a secondary coil by an insulating transformer circuit, and the AC power is further rectified to DC power by a rectifier circuit and output.

The charging side relay circuit section 205 is configured by including a first relay circuit section 206 and a second relay circuit section 208. The first relay circuit section 206 is a relay which is connected in series with a positive-electrode side line 27 and is controlled to be connected or disconnected by a control command from the control section. The second relay circuit section 208 is a relay which is connected in series with a negative-electrode side line 29 and is controlled to be connected or disconnected by a control command from the control section.

The external charging cable section 50 is configured by including a plug 56 for connection with a household AC electric power wall socket which is an output of the external commercial power source, a CCID 54 including a relay for interrupting electric power supply to the charger 202 from the external commercial power source, and a connector 52 for connection to an inlet 207 which is connected to the charger 202.

The power source section 40 is an auxiliary battery which outputs a voltage lower than the output voltage of the electric power storage device 102 which is a main battery, and is charged with a voltage which is decreased by the DC/DC converter circuit 114. The output voltage of the power source section 40 is supplied to the control section 20.

The control section 20 is connected with the power storage device side circuit 100 via a control line 16, and has a function of controlling the power storage device side circuit 100. The control section 20 is also connected with the charging device side circuit 200 via a control line 18 and has a function of controlling the charging device side circuit 200. Here, among the functions of the control section 20, a function of setting a variation suppression coefficient so as to suppress the effects of power variation of the external commercial power source on the estimation of the SOC, during plug-in charging in which charging is performed by using the external commercial power source while estimating the SOC such that the SOC is a predetermined value (80%, for example), will be described. When performing the plug-in charging, charging is performed with the charging period being divided into two stages, i.e. a former-half charging period and a latter-half charging period. During the former-half charging period, charging is performed with electric power of 1 kW, for example, and during the latter-half charging period, charging is performed with electric power of 500 W, for example. Also, while the structure in which the power storage device side circuit 100 and the charging device side circuit 200 are controlled by a single control section will be described, they may be controlled by two control sections.

The control section 20 is configured by including a variation suppression operation processing section 212, a variation suppression coefficient setting processing section 214, and a charged state estimation processing section 216.

The variation suppression operation processing section 212 has a function of computing a charged state estimation operation value Vf (a charged state estimation operation value to be obtained by the current operation), by using a voltage V across the electric power storage device 102 (i.e. a closed circuit voltage CCV of the electric power storage device 102) detected by the voltage sensor 105, a variation suppression coefficient Vt which is set by the variation suppression coefficient setting processing section 214, and a charged state estimation operation value $Vf_L$ which is obtained by the previous operation. More specifically, the variation suppression operation processing section 212 obtains the charged state estimation operation value Vf by using an operation formula of $Vf=(1-t)*Vf_L+t*V$.

The variation suppression coefficient setting processing section 214 has a function of setting a coefficient value initial setting as a variation suppression coefficient during the former-half charging period of the plug-in charging of the electric power storage device 102.

The variation suppression coefficient setting processing section 214 also has a function of changing the variation suppression coefficient t such that, of the voltage V across the electric power storage device and the charged state estimation operation value $Vf_L$, the ratio of the voltage V across the electric power storage device is smaller, for performing an operation of the charged state estimation operation value Vf during the latter-half charging period of the plug-in charging, when the charged state estimation operation value Vf drops during the former-half charging period of the plug-in charging of the electric power storage device 102. More specifically, the variation suppression coefficient setting processing section 214 changes the value of the variation suppression coefficient t to a smaller value, based on a coefficient changing reference value B calculated when the charged state estimation operation value Vf drops during the former-half charging period of the plug-in charging of the electric power storage device 102. Here, when the number of times the charged state estimation operation value Vf drops during the former-half charging period of the plug-in charging of the electric power storage device 102 is x, the variation suppression coefficient setting processing section 214 calculates, as the coefficient changing reference value B, a drop average value A by dividing the sum of values of drop amounts of the charged state estimation operation value Vf during the former-half charging period of the plug-in charging by x. Alternatively, the variation suppression coefficient setting processing section 214 may simply set the number of times x the charged state estimation operation value Vf drops during the former-half charging period of the plug-in charging of the electric power storage device 102 as the coefficient changing reference value B. The coefficient changing reference value B can be determined in this manner because it can be considered that, during the plug-in charging of the electric power storage device 102, the voltage V across the electric power storage device 102 does not drop as no operations that use electric power are performed by the plug-in hybrid vehicle.

The charged state estimation processing section 216 has a function of estimating the SOC of the electric power storage device 102 based on the charged state estimation operation value Vf obtained by the operation of the variation suppression operation processing section 212. The charged state estimation processing section 216 also has a function of performing control of the charger 202 to interrupt the power supply to the electric power storage device 102 when it is determined that the electric power storage device 102 is charged to a predetermined value (80%, for example).

Figure 2:
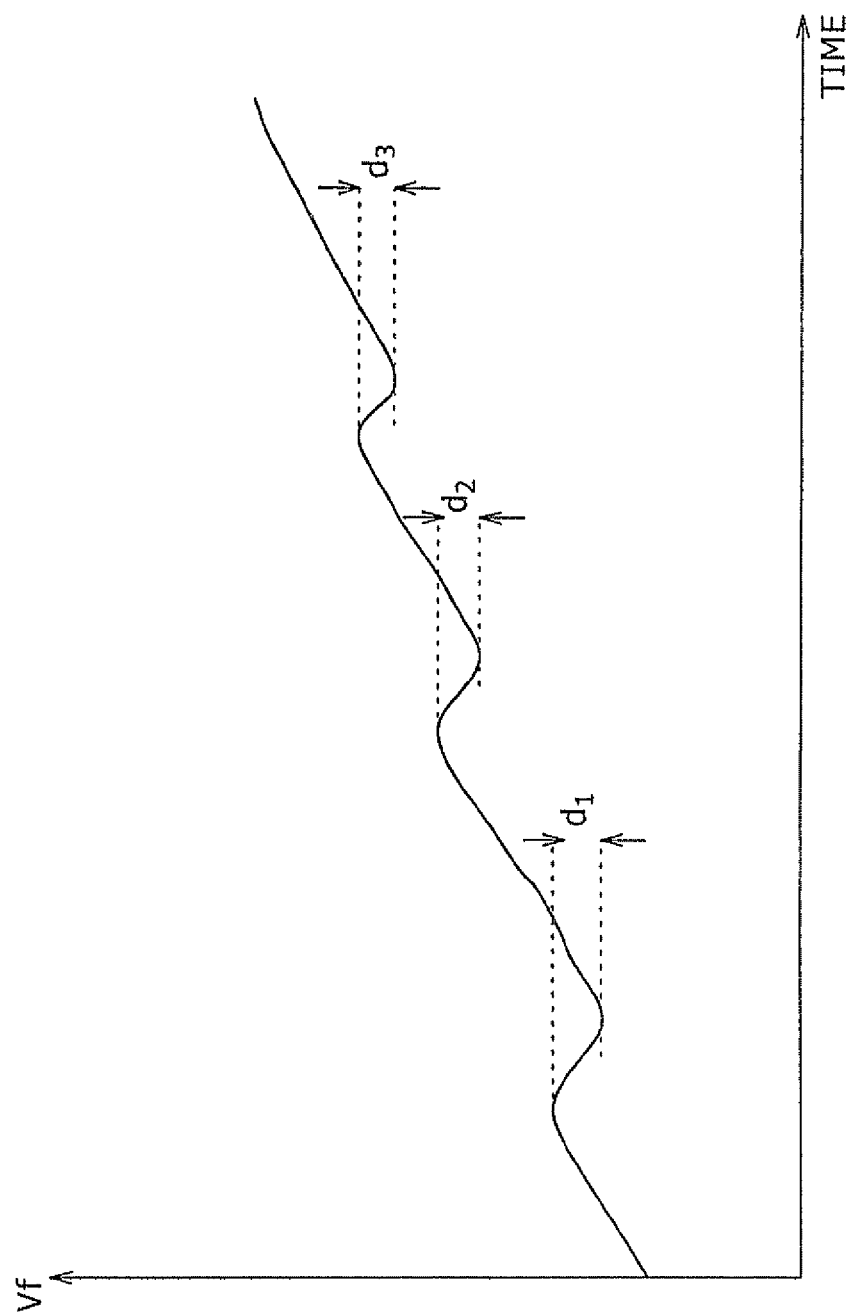
FIG. 2 is a view illustrating a change of a charged state estimation operation value Vf during a former-half charging period of plug-in charging of an electric power storage device, in which the horizontal axis indicates time and the vertical axis indicates the charged state estimation operation value Vf, according to the embodiment of the present invention.

The operation of the charge control system 10 having the above structure will be described with reference to FIGS. 1 and 2. FIG. 2 is a view illustrating a change of the charged state estimation operation value Vf during the former-half charging period of the plug-in charging of the electric power storage device 102, in which the horizontal axis indicates time and the vertical axis indicates the charged state estimation operation value Vf. As illustrated in FIG. 2, during the former-half charging period of the plug-in charging of the electric power storage device 102, the value of the charged state estimation operation value Vf drops three times (x=3), and the drop amounts for the respective times are $d_1$, $d_2$, and $d_3$. Accordingly, the coefficient changing reference value B can be obtained as the drop average value $A=(d_1+d_2+d_3)/3$.

The variation suppression coefficient setting processing section 214 changes the variation suppression coefficient t which is used during the latter-half charging period of the plug-in charging of the electric power storage device 102 to a smaller value in proportion to the coefficient changing reference value B described above. With this operation, it is possible to reduce the effects by V (the closed circuit voltage CCV of the electric power storage device 102), in the operation formula "$(1-t)*Vf_L+t*V$" which is used by the variation suppression operation processing section 212 for obtaining the charged state estimation operation value Vf. As a result, when estimating the SOC of the electric power storage device by using the charged state estimation operation value Vf, the effects by the power variation of the external commercial power source can be reduced. Therefore, according to the structure of the charge control system 10, the estimation accuracy of the SOC of the electric power storage device 102 can be increased.

In the above description, according to the structure of the charge control system 10, it is assumed that during the plug-in charging of the electric power storage device 102, no operations in which electric power is used are performed by the plug-in hybrid vehicle. However, when an operation in which electric power of the electric power storage device 102 is used, such as lighting up the room lamp, lighting up the headlights, or the like, is performed during the plug-in charging, it is possible to detect that an operation of consuming the electric power is being performed and stop the setting change of the variation suppression coefficient t performed by the control section 20.

Reference Numerals List 10 charge control system, 16, 18 control line, 20 control section, 23, 24, 27 positive electrode side line, 25, 26, 29 negative electrode side line, 40 power source section, 50 external charging cable section, 52 connector, 54 CCID, 56 plug, 100 power storage device side circuit, 102 electric power storage device, 103 power storage side relay circuit, 104 first relay circuit section, 105 voltage sensor, 106 relay, 107 second relay circuit section, 108 resistor element, 110 third relay circuit section, 112 power storage side capacitor, 114 DC/DC converter circuit, 116 A/C circuit, 118 step-up/step-down converter circuit, 120 first inverter circuit, 122 second inverter circuit, 124 first motor generator, 126 second motor generator, 200 charging device side circuit, 202 charger, 204 variation suppression coefficient setting processing section, 205 charging side relay circuit section, 206 first relay circuit section, 207 inlet, 208 second relay circuit section, 212 variation suppression operation processing section, 214 variation suppression coefficient setting processing section, 216 charged state estimation processing section.

The invention claimed is:

1. A charge control system, comprising:
an electric power storage device configured to be charged by using alternating current electric power supplied from an external commercial power source;
a voltage detection section configured to detect a voltage V across the electric power storage device;
a charged state estimation value setting section configured to set a charged state estimation value Vf based on the voltage V across the electric power storage device; and
a charged state estimation section configured to estimate a charged state of the electric power storage device based on the charged state estimation value Vf, wherein
the charged state estimation value setting section includes:
an initial state setting section which divides a charging period of the electric power storage device into a first half charging period, which is set as a predetermined period from beginning of charging, and a second half charging period subsequent to the first half charging period, and sets a charged state estimation value Vf for the first half charging period as a value VfL of an initial state;
a variation suppression coefficient setting section which sets a variation suppression coefficient t to be a smaller value in response to: (1) an amount of a voltage drop, which temporarily occurs in response to a variation in power supplied from the external commercial power source, or (2) a number of voltage drops, based on rising characteristics of the voltage V across the electric power storage device that rises with charging when there is no variation in power supplied from the external commercial power source in the first half charging period, the variation suppression coefficient having a value that is not equal to zero or one; and
a variation suppression section which sets a charged state estimation value Vf for the second half charging period using $Vf=(1-t)*VfL+t*V$, using the variation suppression coefficient t which is set by the variation suppression coefficient setting section.

2. The charge control system according to claim 1, wherein when the number of times the voltage drops within the first half charging period is x, the variation suppression coefficient setting section sets the variation suppression coefficient t based on a voltage drop average value obtained by dividing a sum of voltage drop amounts within the first half charging period x.

3. The charge control system according to claim 1, wherein when the number of times the voltage drops within the first half charging period is x, the variation suppression coefficient setting section sets the variation suppression coefficient t based on x.

* * * * *